(12) United States Patent
Huang et al.

(10) Patent No.: US 11,961,778 B2
(45) Date of Patent: Apr. 16, 2024

(54) SEMICONDUCTOR DEVICE PACKAGE HAVING MULTI-LAYER MOLDING COMPOUND AND METHOD

(71) Applicant: Western Digital Technologies, Inc., San Jose, CA (US)

(72) Inventors: Shenghua Huang, Shanghai (CN); Yangming Liu, Shanghai (CN); Bo Yang, Milpitas, CA (US); Ning Ye, Milpitas, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 257 days.

(21) Appl. No.: 17/486,322

(22) Filed: Sep. 27, 2021

(65) Prior Publication Data
US 2023/0101826 A1    Mar. 30, 2023

(51) Int. Cl.
| H01L 23/31 | (2006.01) |
| H01L 23/00 | (2006.01) |
| H01L 23/29 | (2006.01) |
| H01L 23/552 | (2006.01) |
| H01L 25/065 | (2023.01) |

(52) U.S. Cl.
CPC ........ *H01L 23/3135* (2013.01); *H01L 23/295* (2013.01); *H01L 23/3121* (2013.01); *H01L 23/552* (2013.01); *H01L 24/48* (2013.01); *H01L 25/0657* (2013.01); *H01L 2224/48225* (2013.01); *H01L 2924/3862* (2013.01)

(58) Field of Classification Search
CPC .................................................... H01L 23/3135
See application file for complete search history.

(56) References Cited

U.S. PATENT DOCUMENTS

| 2015/0061157 A1* | 3/2015 | Yu ........................ H01L 25/50 257/777 |
| 2021/0066249 A1* | 3/2021 | Niwa ...................... H01L 24/83 |

* cited by examiner

*Primary Examiner* — Yu-Hsi D Sun
(74) *Attorney, Agent, or Firm* — Morgan, Lewis & Bockius LLP

(57) ABSTRACT

A semiconductor device package includes a substrate having a top planar surface and a first semiconductor die electrically connected to the top planar surface of the substrate. The first semiconductor die and substrate define a tunnel and a first molding compound encapsulates the first semiconductor die and fills the tunnel. A second molding compound that is separate and distinct from the first molding compound is mounted on a top surface of the first molding compound. The first molding, when in a flowable state, has a viscosity that is lower than a viscosity of the second molding compound when it is in a flowable state.

20 Claims, 4 Drawing Sheets

SEMICONDUCTOR DEVICE PACKAGE HAVING MULTI-LAYER MOLDING COMPOUND AND METHOD

BACKGROUND

The present disclosure generally relates to packaging for semiconductor devices (e.g., NAND flash devices) and assembly thereof and, more particularly, to a package having more than one layer of molding compounds and methods of assembly thereof.

Semiconductor device packages typically include one or more integrated circuit (IC) dies (e.g., NAND dies, ASIC dies, controller dies, etc.) and/or other semiconductor devices that are electrically coupled to a substrate by bond wires or solder balls that convey electrical signals between the dies and substrate. These packages often include a molding compound (e.g., an encapsulant) for protecting the components of the semiconductor device package. The molding compound may be introduced as a liquid or semi-liquid material that is flowed over the dies and bond wires and flowed through tunnels defined by the dies and subsequently cured or hardened. However, flowing the molding compound often leads to the occurrence of "wire sweep" in which the bond wires are displaced from their original alignment in the horizontal plane, causing one or more of the bond wires to physically contact one or more adjacent bond wires causing a short in the bond wires. Furthermore, the liquid mold compound may fail to fill the tunnel defined by the dies. Additionally, other protective means and/or materials are often mounted on the molding compound to protect the components of the semiconductor package from any external interference. For example, an electromagnetic interference (EMI) shielding layer is often adhered to the cured molding compound to protect the components of the semiconductor package from electromagnetic disturbance. However, the EMI layer may be prone to peeling from the molding compound because of poor adhesion to certain materials, reducing the protection of the EMI shield.

Therefore, there is a need to provide a semiconductor device package that includes molding compounds configured to prevent wire sweep, fill tunnel structures, and reduce the occurrence of EMI layer peeling.

SUMMARY

In one embodiment there is a semiconductor device package including a substrate having a top planar surface and a first semiconductor die electrically connected to the top planar surface of the substrate. The substrate and the first semiconductor die define at least a portion of a tunnel. The semiconductor device package further includes a first molding compound at least partially encapsulating the first semiconductor die and substantially filling the tunnel. The semiconductor device package further includes a second molding compound formed on a top surface of the first molding compound and the second molding compound is separate and distinct from the first molding compound. The first molding compound, when in a flowable state, has a viscosity that is lower than a viscosity of the second molding compound when the second molding compound is in a flowable state.

In some embodiments, the semiconductor device package further includes an electromagnetic interference protective layer adhered to a top surface of the second molding compound. In some embodiments, the second molding compound has a higher adhesion strength to the electromagnetic interference protective layer than an adhesion strength of the first molding compound to the electromagnetic interference protective layer. In some embodiments, the semiconductor device package further includes a second semiconductor die mounted on the top planar surface of the substrate and positioned within the tunnel and one or more bond wires electrically connecting the second semiconductor die to the substrate. The first molding compound is configured to reduce the occurrence of wire sweep of the one or more bond wires.

In some embodiments, the first molding compound and second molding compound each have a corresponding volume and the volume of the first molding compound is greater than the volume of the second molding compound. In some embodiments, the semiconductor device package further includes two or more spacers mounted to the top planar surface of the substrate, wherein the two or more spacers, the first semiconductor die, and the top planar surface of the substrate define the tunnel and the first semiconductor dies is mounted on a top planar surface of each of the two or more spacers. In some embodiments, the first molding compound is a type of epoxy mold compound including epoxy resin and silica fillers. In some embodiments, the second molding compound is a type of epoxy mold compound including modified epoxy resin and silica fillers. In some embodiments, the first molding compound has a viscosity of up to 10 pascal-seconds.

In another embodiment, there is a semiconductor package including a substrate means for providing electrical communication to one or more electrical components coupled to the substrate means and one or more storage means for providing a first storage amount and connected to a top planar surface of the substrate means, the one or more storage means and the substrate means defining at least a portion of a tunnel. The semiconductor package further includes a first control means for providing electrical communication with the first storage means, the first control means mounted on the top planar surface of the substrate means and positioned within the tunnel and a first encapsulation means for at least partially encapsulating the one or more spacing means, the first storage means, and the first control means, the first encapsulation means substantially filling the tunnel. The semiconductor device package further includes a second encapsulation means for covering a top planar surface of the first encapsulation means. The first encapsulation means, when in a flowable state, has a viscosity that is lower than a viscosity of the second encapsulation means, when in a flowable state and the first encapsulation means is separate and distinct from the second encapsulation means.

In some embodiments, the semiconductor device package further includes a protective means for providing protection to the semiconductor device package from electromagnetic interference, the protective means adhered to at least a top surface of the second encapsulation means. In some embodiments, the second encapsulation means has a higher adhesion strength to the protective means than an adhesion strength of the first encapsulation means to the protective means. In some embodiments, the semiconductor device package further includes one or more electrical connection means for electrically connecting the first control means to the substrate means and the first encapsulation means is configured to reduce the occurrence of wire sweep of the one or more electrical connection means. In some embodiments, the first encapsulation means and second encapsulation means each have a corresponding volume and the volume of the first encapsulation means is greater than the volume of the second encapsulation means.

In another embodiment there is a method of forming a semiconductor device package including providing a substrate having a top planar surface and one or more components coupled to the substrate, the one or more components including a first semiconductor die connected to the top planar surface of the substrate, wherein the substrate and the first semiconductor die defines at least a portion of a tunnel, and a second semiconductor die mounted on the top planar surface of the substrate and positioned within the tunnel, the second semiconductor die electrically connected to the substrate by one or more bond wires. The method further includes forming a mold, the mold including a first molding compound and a second molding compound. The second molding compound is separate and distinct from the first molding compound and the first molding compound, when in a flowable state, has a viscosity that is less than a viscosity of the second molding compound, when in a flowable state. The method further includes compressing the mold on the substrate causing the first molding compound to liquify and encapsulate the semiconductor die and substantially fill the tunnel. The first molding compound at least partially encapsulates the first semiconductor die and the second semiconductor die and the second molding compound is separated from the first semiconductor die by a portion of the first molding compound.

In some embodiments, the method further includes depositing an electromagnetic interference protective layer to at least a top surface of the second molding compound. In some embodiments, the second molding compound has a higher adhesion strength to the electromagnetic interference protective layer than an adhesion strength of the first molding compound to the electromagnetic interference protective layer. In some embodiments, the first molding compound is configured to reduce the occurrence of wire sweep of the one or more bond wires. In some embodiments, a volume of the first molding compound is greater than a volume of the second molding compound. In some embodiments, the first molding compound has a viscosity of up to 10 pascal-seconds.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
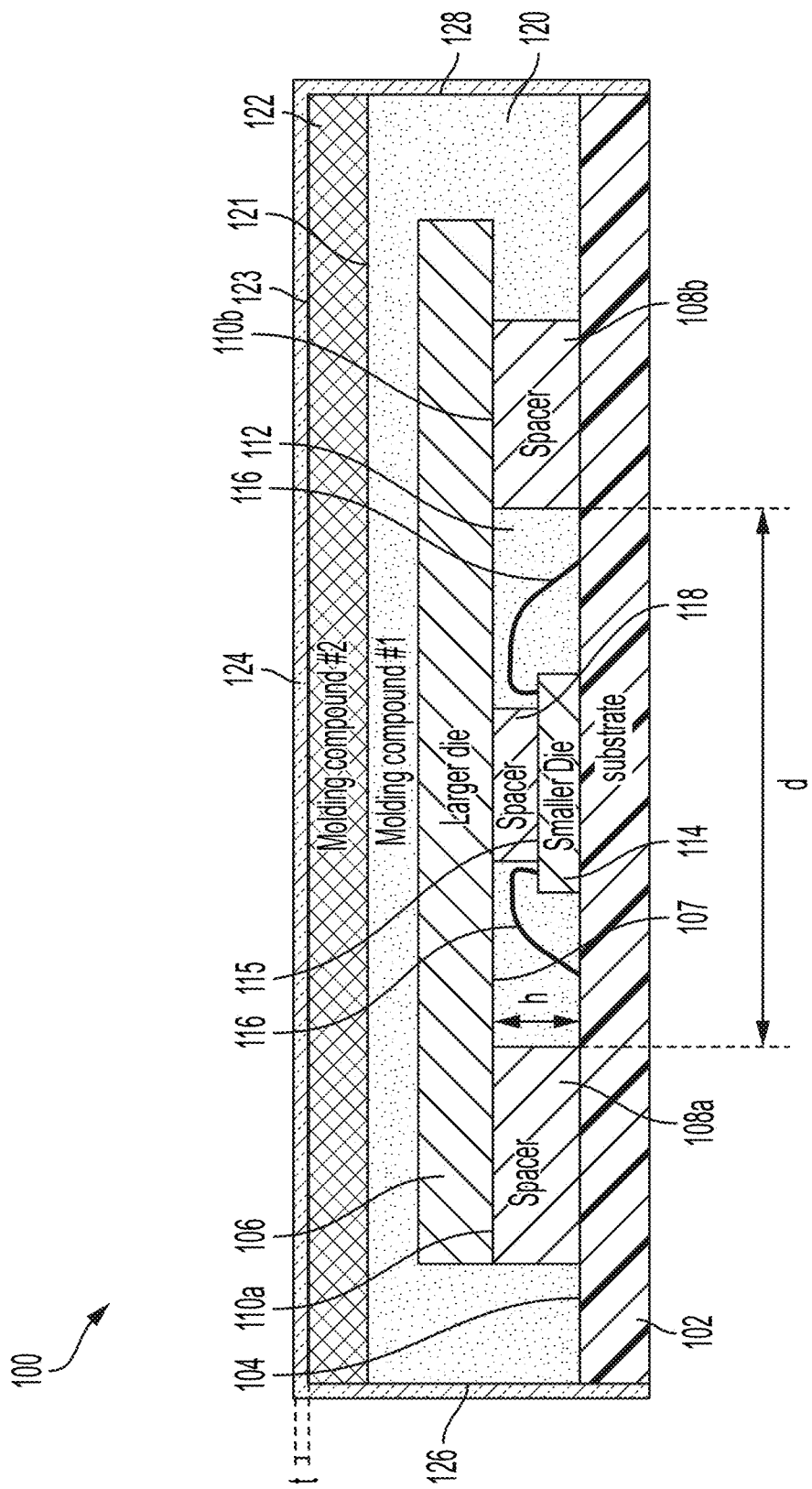
FIG. 1 is a cross-sectional view of a portion of a semiconductor device package in accordance with an exemplary embodiment of the present disclosure.

Referring to FIG. 1, there is shown a semiconductor device package, generally designated 100, in accordance with an exemplary embodiment of the present disclosure. The semiconductor device package 100 may include a substrate 102 having a top planar surface 104, and a first semiconductor die 106 connected to the substrate 102. The substrate 102 may include one or more electrical connections (e.g., electrical wiring, signal traces, etc.), not shown, disposed within the substrate 102 to provide electrical communication with one or more components coupled to the substrate 102. The package 100 described here is a memory device. However, the inventive concepts discussed herein apply to other semiconductor device packages, as will be understood by those of skill in the art. The first semiconductor dies 106 may be, for example, NAND dies or other memory chips each for providing a storage amount. Although a single first semiconductor die 106 is shown in FIG. 1, it will be understood that the semiconductor package 100 may include any number of semiconductor dies stacked (e.g., one on top of another) or disposed side-by-side (not stacked). For example, there may be from one-sixteen or more semiconductor dies stacked one upon another and mounted on first semiconductor die 106. In some embodiments, the first semiconductor die 106 is spaced from the top planar surface 104 of substrate 102 such that the first semiconductor die 106 does not directly contact or rest on the top planar surface 104. In some embodiments, the first semiconductor die 106 is electrically connected to substrate 102 with one or more bond wires (not shown).

In some embodiments, the semiconductor device package 100 may include two or more spacers 108 for spacing the one or more semiconductor dies 106 from the top planar surface 104 of substrate 102. The spacers 108 may comprise blank semiconductor dies, a composite material (e.g., cured epoxy), or the like, so long as they function to provide space between discrete parts and do not interfere with the circuit functionality. For example, the semiconductor device package 100 may include two spacers 108a and 108b mounted on the top planar surface 104 of the substrate 102. The spacers 108a and 108b may each include a top planar surface 110a and 110b spaced from the top planar surface 104 of the substrate 102 by a height h measured in a direction generally perpendicular to the top planar surface 104 of substrate 102. In some embodiments the height h of the spacers 108a and 108b is about 0.1 millimeters. Here, the term about means+/−10%. In some embodiments, the spacers 108a and 108b are of equal height. In other embodiments, the height of one of the spacers 108a and 108b may be different than the height of the other spacer 108a or 108b. The spacers 108a and 108b may be positioned at different locations on the top planar surface 104 of substrate 102 such that there is a distance d between spacer 108a and spacer 108b. The distance d between the spacers 108a and 108b may be measured in a direction generally parallel to the top planar surface 104 of substrate 102. In some embodiments, the distanced is between about 0.5 millimeters to about 5 millimeters. The spacers 108a and 108b shown in FIG. 1 have a generally rectangular cross-sectional shape, however the spacers 108a and 108b may have another cross-sectional shape such as, for example, a generally square cross-sectional shape, a generally quadrilateral shape, a generally hexagonal shape, a generally octagonal shape, or a generally trapezoidal shape. In some embodiments, the spacers 108a and 108b are comprised of, for example, silicon.

The first semiconductor die 106 may be mounted on the spacers 108a and 108b such that a bottom planar surface 107 of the first semiconductor die 106 is spaced from the top planar surface 104 of substrate 102. For example, the bottom planar surface 107 of the first semiconductor die 106 may be mounted on the top planar surfaces 110a and 110b of the corresponding spacers 108a and 108b. In this manner, the bottom planar surface 107 of the first semiconductor die is spaced from the top planar surface 104 of the substrate 102, in a direction generally perpendicular to the top planar surface 104, by a distance generally equal to the height h of the spacers 108a and 108b. In some embodiments, the first semiconductor die 106 may be fixedly coupled to the spacers 108a and 108b. For example, an adhesive layer or film (e.g., die attach film) may be disposed between the bottom surface 107 of the first semiconductor die 106 and the top planar surfaces 110a and 110b of the spacers 108a and 108b to adhere the first semiconductor die 106 to said spacers 108a and 108b. The first semiconductor die 106 and substrate 102 may define at least a substantial portion of a tunnel 112 within which one or more other semiconductor dies and/or spacers may be positioned. In some embodiments, the first semiconductor die 106, substrate 102, and spacers 108a and 108b define the tunnel 112. For example, the tunnel 112 may be defined by the top planar surface 104 of substrate 102, the bottom planar surface of the first semiconductor die 106 and the one or more spacers 108a and 108b. Put another way, the tunnel 112 may be defined by the space between the top planar surface 104 of the substrate 102 and the bottom planar surface 107 of the first semiconductor die 106 and the space between the spacers dies 108a and 108b. In some embodiments, the dimensions of the tunnel 112 correspond to the height h and distance d between the spacers 108a and 108b.

In some embodiments, the semiconductor device package 100 includes a second semiconductor die 114 mounted on the top planar surface 104 of substrate 102 and positioned within tunnel 112. In one embodiments, the second semiconductor die 114 is a control die configured to provide electrical communication with the one or more first semiconductor dies 106. In some embodiments, for example, the second semiconductor die 114 is an application specific integrated circuit (ASIC) chip configured to control the functionality of the one or more first semiconductor dies 106. In some embodiments, the second semiconductor die 114 is electrically connected to the substrate 102 by one or more bond wires 116. In other embodiments, the second semiconductor die 114 is a flip-chip die that is mounted on an electrically connected to the substrate with solder balls or pillars. In some embodiments, the semiconductor device package 100 includes a die mounted spacer 118 positioned in tunnel 112. In some such embodiments, die mounted spacer 118 is disposed between first semiconductor die 106 and second semiconductor die 114. For example, die mounted spacer 118 in some embodiments is mounted on a top planar surface 115 of the second semiconductor die 114. The die mounted spacer 118 may extend from the top planar surface 115 of the second semiconductor die 114 to the bottom planar surface 107 of the first semiconductor die 106. In some embodiments, the die mounted spacer 118 is comprised of silicon.

In some embodiments, the tunnel 112 may have an associated total volume determined by the height h of and distance d between the spacers 108a and 108b and by the depth of the spacers 108a and 108b. The depth of the spacers 108a and 108b refers the length that the spacers 108a and 108b extend in a direction that is normal to the orientation of the cross-sectional view shown in FIG. 1. Put another way, the depth of the spacers 108a and 108b is defined by the length of said spacers 108a and 108b measured in a direction that extends along an axis (not shown) that is directed out of, and/or in to, the page from what is shown in FIG. 1. In some embodiments, the depth of each spacer 108a and 108b is generally the same. In other embodiments, the depth of one of the spacers 108a and 108b may be different than the other. The first semiconductor die 106 may have an associated depth that is measured in a direction generally the same as the direction that the depth of the spacers 108a and 108b are measured in. In some embodiments, the first semiconductor die 106 may have an associated depth that is greater than or equal to the depth of the spacers 108a and 108b. In other embodiments, the depth of the first semiconductor die 106 may be less than the depth of the spacers 108a and 108b. Similarly, the second semiconductor die 114 and die mounted spacer 118 may each have associated depths that are each measured in a direction generally the same as the direction that the depth of the spacers 108a and 108b are measured in. In some embodiments, the depth of the second semiconductor die 114 is less than the depth of the spacers 108a and 108b. In some embodiments, the depth of the die mounted spacer 118 is less than or equal to the depth of the second semiconductor die 114. Accordingly, a first portion of the total volume of the tunnel 112 may be filled by the second semiconductor die 114 and the die mounted spacer 118. The remaining volume of the tunnel 112 may be substantially filled by an encapsulation means.

The semiconductor package 100 includes a first encapsulation means (e.g., a first molding compound 120) configured to at least partially encapsulate one or more components coupled to the substrate 102. For example, the first molding compound 120 may be configured to at least partially or entirely encapsulate the spacers 108a, 108b, the first semiconductor die 106, the second semiconductor die 114, the die mounted spacer 118, and/or the one or more bond wires 116. The first molding compound 120 may be configured to substantially fill the tunnel 112. For example, the first molding compound 120 may substantially fill the remaining volume of the tunnel 112 that is not filled by the second semiconductor die 114 and the die mounted spacer 118.

In some embodiments, the first molding compound 120 may be a compound having a flowable state (e.g., liquid or semi-liquid state) with a viscosity that allows the first molding compound 120 to substantially fill the tunnel 112. It will be understood that the viscosity of the first molding compound 120 refers to the viscosity of the molding compound 120 while it is in a flowable state. In some embodiments, the first molding compound 120 has a viscosity of between about 1-100 pascal-seconds. In some embodiments, the first molding compound 120 has a viscosity of between about 7-13 pascal-seconds. In some embodiments, the first molding compound 120 has a viscosity value low enough that the first molding compound 120, when flowed, does not cause wire sweep. The first molding compound 120 may be an epoxy molding compound comprised of epoxy resin and silica fillers.

As discussed above, certain molding compounds may fail to fill tunnels similar to the tunnels 112 shown in FIG. 1. For example, certain molding compounds may be selected to have good adhesion to a protective layer (e.g., an electromagnetic interference protective layer). However, such molding compounds may have a higher viscosity that makes it difficult to fill the tunnels with said molding compounds. By providing a first molding compound 120, having any one of the viscosity values or viscosity ranges, as discussed above, the first molding compound 120 may be flowed through, or compressed in, and substantially fill tunnel 112. In some embodiments, the first molding compound 120 is configured to reduce the occurrence of, or prevent, wire sweep of the one or more bond wires 116. The term "wire sweep" refers to an occurrence in which the bond wires are displaced from their original alignment, causing one or more of the bond wires to physically contact one or more adjacent bond wires thereby causing a short in said bond wires. In some embodiments, by providing a first molding compound 120, having any one of the viscosity values or viscosity ranges, as discussed above, the first molding compound 120 may be flowed through, or compressed on, tunnel 112 such that the first molding compound encapsulates the second semiconductor die 114 and the associated bond wires 116 while reducing the risk of, or preventing, the occurrence of wire sweep of the one or more bond wires 116.

The semiconductor device package 100 includes a second molding compound 122 configured to couple one or more protective layers to the semiconductor device package 100. While the first molding compound 120 may be selected to substantially fill tunnel 112, the second molding compound 122 may be selected to provide better adhesion to a protective layer, as discussed below. The second molding compound 122 may be mounted on a top planar surface 121 of the first molding compound 120 and may be separate and distinct from the first molding compound 120. The first semiconductor die 106, second semiconductor die 114, bond wires 116, spacers 108a and 108b and the die mounted spacer 118 may be separated from the second molding compound 122 by a portion of the first molding compound 120. For example, the first molding compound 120, shown in FIG. 1, entirely encapsulates the first semiconductor die 106, second semiconductor die 114, bond wires 116, spacers 108a and 108b and the die mounted spacer 118, such that a portion of the first molding compound 120, between the top planar surface 121 of first molding compound 120 and the first semiconductor die 106, separates the second molding compound 122 from said components. Similarly, the second molding compound 122 may not fill tunnel 112. In some embodiments, the first molding compound 120 is disposed between the substrate 102 and the second molding compound 122. In some embodiments, the second molding compound 120 may be selected to have a viscosity, in its flowable state, that is higher than the viscosity of the first molding compound 120. It will be understood that the viscosity of the second molding compound 122 refers to the viscosity of the second molding compound 122 when in its flowable state. For example, the second molding compound 122 may have a viscosity of between about 20-40 pascal-seconds. The second molding compound 122 may be an epoxy molding compound comprised of modified epoxy resin and silica fillers. In some embodiments, the silica filler content of the second molding compound 122 may be greater than the silica filler content of the first molding compound 120.

Figure 2:
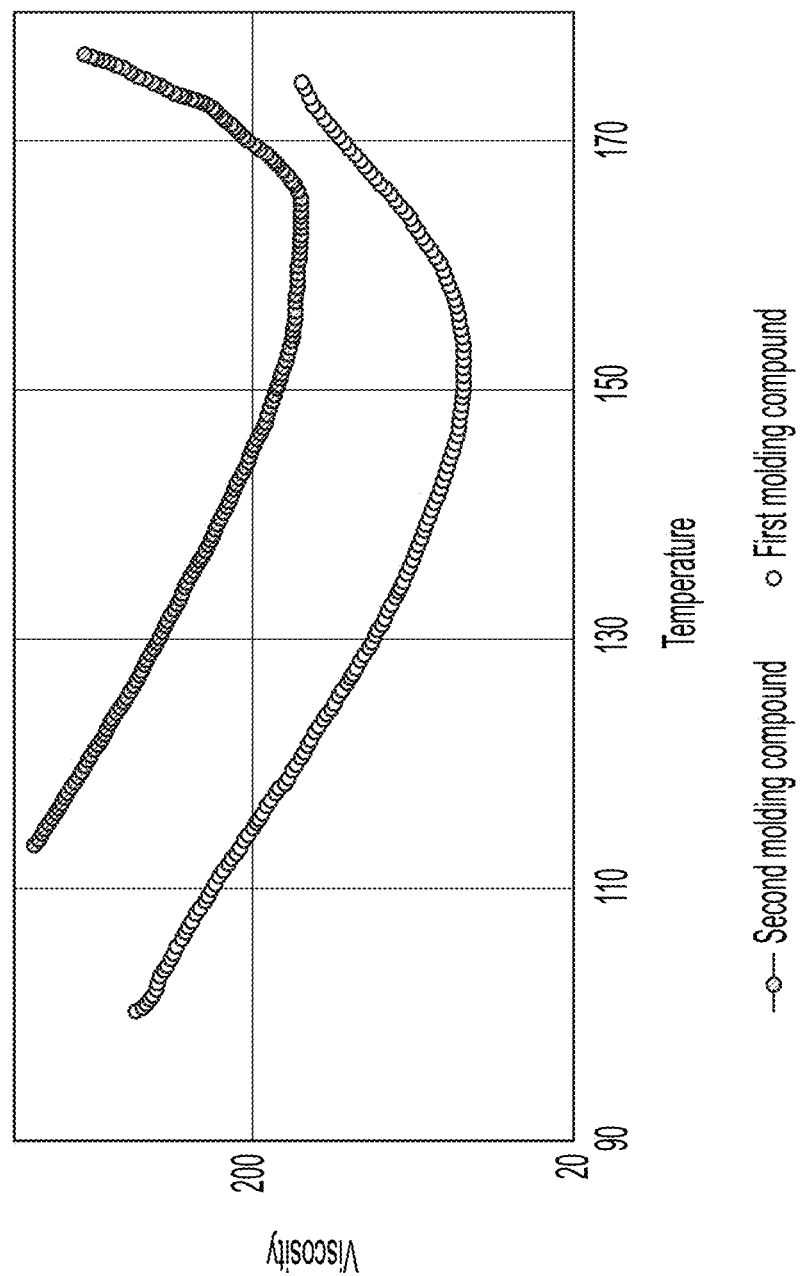
FIG. 2 is a graph illustrating the relation of viscosity and temperature of different molding compounds included in the semiconductor device package of FIG. 1.

Referring to FIG. 2, the second molding compound 122 has a higher viscosity than the first molding compound 120. For example, the graph in FIG. 2 depicts the viscosity, in pascal-seconds, of the first molding compound 120 and second molding compound 122 at various temperatures. The viscosity of the first molding compound 120, is less than the viscosity of the second molding compound 122 when both the first and second molding compounds 120, 122 are at the same temperature.

Referring back to FIG. 1, the semiconductor device package 100 may include one or more protective layers configured to protect the components of the semiconductor device package 100 from absorbing or emitting interference. For example, an electromagnetic interference (EMI) protective layer 124 may be coupled to the semiconductor device package 100 to protect the first semiconductor die 106 and second semiconductor die 114 from absorbing electromagnetic interference from electronic devices and/or components external to the semiconductor device package 100. Similarly, the EMI protective layer 124 may prevent electromagnetic interference emitted by the semiconductor device package 100 from interfering with electronic devices external to the semiconductor device package 100. In some embodiments, for example, EMI protective layer 124 may include a thin coating (e.g., 5 micron) of copper or other suitable shielding materials. In conventional semiconductor device packages, an EMI protective layer, similar to the EMI protective layer 124, are prone to peeling in which the protective layer at least partially peels off of the corresponding surface to which it is coupled. Peeling of the EMI protective layer may allow electromagnetic interference to be absorbed by or transmitted from said semiconductor device package, thereby having a negative impact on the functioning of the semiconductor device package.

To reduce the occurrence of, or prevent, peeling of the EMI layer 124, the EMI layer 124 may be adhered to the second molding compound 122. In some embodiments, the EMI protective layer 124 is adhered at least to the top planar surface 123 of the second molding compound. The second molding compound 122 may have an adhesion strength that is greater than the adhesion strength of the first molding compound 120. The adhesion strength of the EMI protective layer 124 to the second molding compound 122 may be tested via conventional adhesion strength testing methods known to those skilled in the art. However, an adhesion strength test the same or similar to a peel strength test may be preferable to other common adhesion strength tests due to the thickness of the EMI protective layer 124. For example, the EMI protective layer 124 may have a thickness t of about 5 microns, which may make testing the adhesion strength of the EMI protective layer 124 with the second molding compound 122 more difficult with certain adhesion strength tests than with other tests. The adhesion strength may be tested, for example, using a peel strength test in which cuts are made through the thickness of the EMI protective layer 124 to segment the EMI protective layer 124 into multiple sections. Adhesive strips are applied to the sections of the EMI protective layer 124 opposite where the EMI protective layer 124 is adhered to the top planar surface 123 of the second molding compound 122. The adhesive strips are removed, or peeled, from the surface of the EMI protective layer 124 to test whether the sections of the EMI protective layer 124 detach, or peel, from the top planar surface 123 of the second molding compound 122.

In some embodiments the EMI protective layer 124 and substrate 102 may enclose the first molding compound 120, second molding compound 122, first semiconductor die 106, second semiconductor die 114, spacers 108a, 108b, bond wires 116, and/or the die mounted spacer die 118. For example, the EMI protective layer 124 substantially covers the top planar surface 123 of the second molding compound 122 and the first lateral surface 126 and second lateral surface 128. For simplicity and ease of understanding, the first and second lateral surfaces 126, 128 are each referenced in the figures with corresponding reference numbers. However, it will be understood that the first and second lateral surfaces 126, 128 are each comprised of the corresponding lateral surfaces of the substrate 102, the first molding compound 120 and the second molding compound 122. The EMI protective layer 124 may be adhered to the first lateral surface 126 and second lateral surface 128 such that the EMI protective layer 124 substantially covers said lateral surfaces 126, 128.

As discussed above, the EMI protective layer 124 may be adhered to the top planar surface 123 of the second molding compound 122 to reduce the occurrence of, or prevent, peeling of the EMI protective layer 124. The top planar surface 123 of the second molding compound 122, in some embodiments, may define a surface area that is greater than the surface area of the first and second lateral surfaces 126 and 128 individually. As such, the risk of the EMI protective layer 124 peeling from the first and second lateral surfaces 126 and 128 may be less than the risk of peeling at the top planar surface 123 of the second molding compound 122 regardless of the adhesive strength(s) of the first or second molding compounds 120, 122. Therefore, even though in some embodiments a portion of the EMI protective layer 124 is adhered to the first and second lateral surfaces 126, 128 partially by the first molding compound 120, it will be understood that the second molding compound 122 prevents, or reduces the occurrence of peeling of the EMI protective layer 124 without the second molding compound 122 entirely defining the first and second lateral surfaces 126 and 128. In some embodiments, however, the second molding compound 122 may define a greater portion, or substantially all of the first and second lateral surfaces 126 and 128. For example, a portion of the second molding compound 122 may cover substantially all of the first and second lateral surfaces 126 and 128.

In some embodiments, by providing the first molding compound 120 and the second molding compound 122, as described above, the semiconductor package 100 may be configured to substantially fill tunnel 112, reduce the risk of, or prevent, wire sweep of the one or more bond wires 116, and reduce the risk of, or prevent peeling of the EMI protective layer 124. Each of the first molding compound 120 and second molding compound 122 have corresponding volumes, or amounts, that are provided to the semiconductor device package 100. The amount of each of the first molding compound 120 that is provided may correspond to the amount of the molding compound 120 required to encapsulate the first semiconductor die 106, second semiconductor die 114, spacer dies 108a, 108b, bond wires 116, and the die mounted spacer die 118. As discussed above, additional semiconductor dies may be mounted, one on top of another, to the first semiconductor die 106 to form a stacked die structure. In instances where the semiconductor device package 100 includes a stacked die structure, the volume of the first molding compound 120 provided may be a volume capable of encapsulating each of the dies included in the stacked die structure as well as the components encapsulated by the first molding compound 120 shown in FIG. 1. The cost of a quantity of each of the first and second molding compounds 120, 122 may be unequal. For example, in some embodiments, the cost of a volume of the first molding compound 120 may be less than the cost of the same volume of the second molding compound 122. Therefore, it may be more cost effective to provide a volume of the first molding compound 120 that is greater than the volume of the second molding compound 122. As such, in some embodiments, the volume of the second molding compound 122 is less than the volume of the first molding compound 120. In instances where the semiconductor device package 100 includes a stacked die structure, the volume of the second molding compound 122 provided may remain generally the same while the volume of the first molding compound 120 is larger to accommodate for the additional dies included in the stacked die structure.

Figure 3:
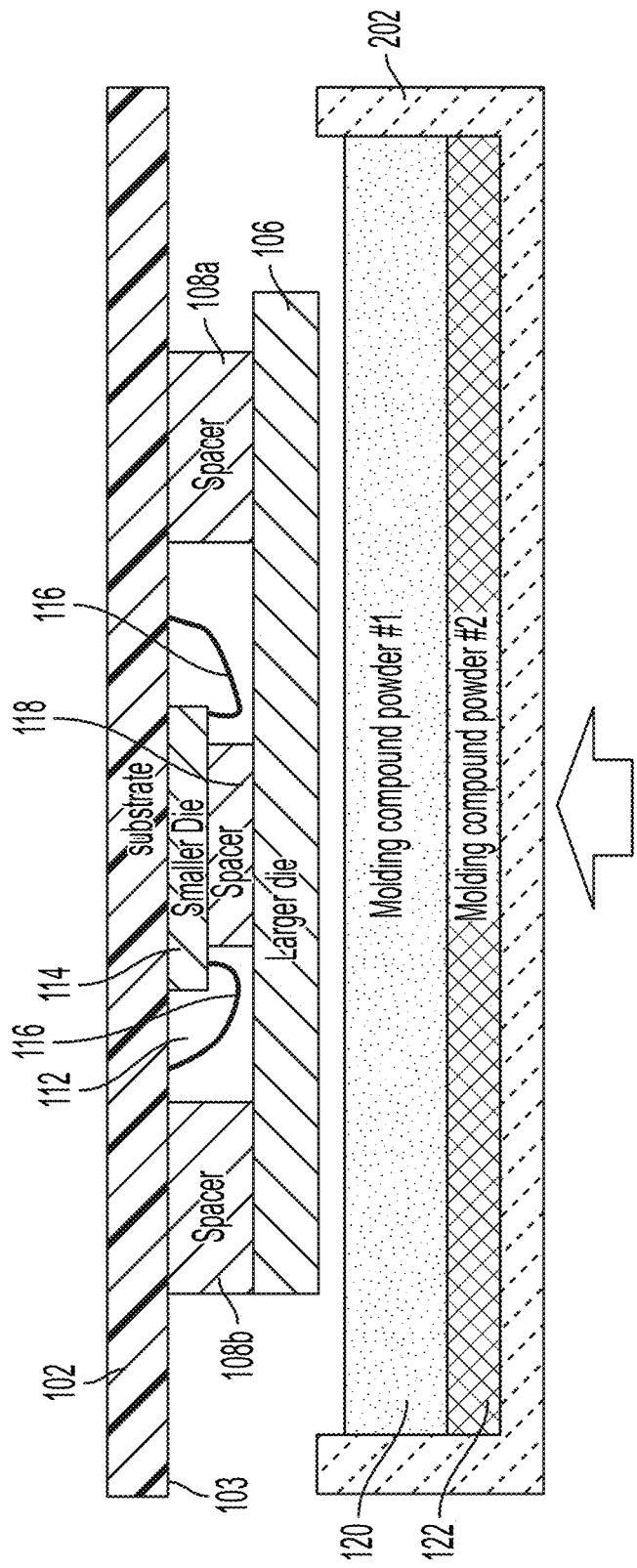
FIG. 3 is a cross-sectional view illustrating assembly of the semiconductor device package of FIG. 1 in accordance with an embodiment of the present disclosure.

Referring to FIG. 3, there is shown a cross-sectional side view illustrating assembly of the semiconductor device package 100, in accordance with an embodiment of the present disclosure. In some embodiments, the substrate 102 may be provided with one or more components coupled to the substrate 102. For example, the one or more components coupled to the substrate 102 may include one or more of the spacers 108a, 108b, the first semiconductor die 106, the second semiconductor die 114, bond wires 116, and/or the die mounted spacer 118. In some embodiments, the assembly of the semiconductor device package 100 may be accomplished by compression molding. For example, the substrate 102 and the components connected thereto, may be positioned above a mold 202 that contains a volume of the first mold compound 120 and a volume of the second mold compound 122. In some embodiments, the volume of the first mold compound 120 and volume of the second mold compound 122 may be provided in the form of a powder. A volume of the second mold compound 122, in a powder form, may be provided to the mold trace 202 such that the second mold compound 122 covers a bottom surface of the mold 202. A volume of the first mold compound 120 may then be provided, in powder form, such that the first mold compound 120 is disposed above the second mold compound 122.

A force may be applied to the mold 202 (e.g., a force in the direction of the arrow in FIG. 3) such that the mold 202 is compressed onto the substrate 102 and the components connected thereto. In some embodiments, the volume of the first mold compound 120 and second mold compound 122 provided may be predetermined such that when compressed onto the substrate 102, the components connected thereto are immersed in the first molding compound 120 and not the second molding compound 122. During compression of the mold 202 onto the substrate 102, and the components connected thereto, the first molding compound 120 and second molding compound 122 transition from a powder state to a liquid, or semi-liquid, state allowing the first molding compound 120 to encapsulate the first semiconductor die 106, spacers 108a, 108b, the second semiconductor die 114, bond wires 116, and/or die mounted spacer 118. The first molding compound 120, may also substantially fill tunnel 112, as discussed above, during compression of the mold trace 202. In some embodiments, after compression of the mold trace 202, the first and second molding compounds 120, 122 may be cured or hardened such that the liquid mold compound hardens to protect the substrate 102, first semiconductor die 106, spacers 108a, 108b, second semiconductor die 114, bond wires 116, and/or the die mounted spacer 118. In some embodiments, the EMI protective layer 124 is adhered to the second molding compound 122 to form the semiconductor device package 100, as shown in FIG. 1. In some embodiments, the EMI protective layer 124 is adhered to the top planar surface 123 of the second molding compound 122 and the first and second lateral surfaces 126, 128 via a deposition procession (e.g., physical vapor deposition) after the first and second molding compounds 120 and 122 hardened.

While a compression molding process is shown and described with reference to FIG. 3, it will be understood that other conventional assembly processes may be used to assemble the semiconductor package 100 of the present disclosure. For example, instead of compression molding, the first mold compound 120 may be flowed over the substrate 102, and the components connected thereto such that the first mold compound 120 substantially fills tunnel 112 and encapsulates said components. The first mold compound 120 may be cured or hardened such that the liquid mold compound hardens to protect the components. A top surface of the cured first mold compound 120 may optionally be polished to remove a thin surface layer of the first molding compound 120. The second molding compound 122, in a liquid or semi-liquid state, may be flowed over the top surface of the cured first mold compound 120. Similarly, the second molding compound 122 may be cured or hardened such that the liquid mold compound hardens to protect the components and the EMI protective layer 124 may be adhered to the second molding compound 122.

Figure 4:
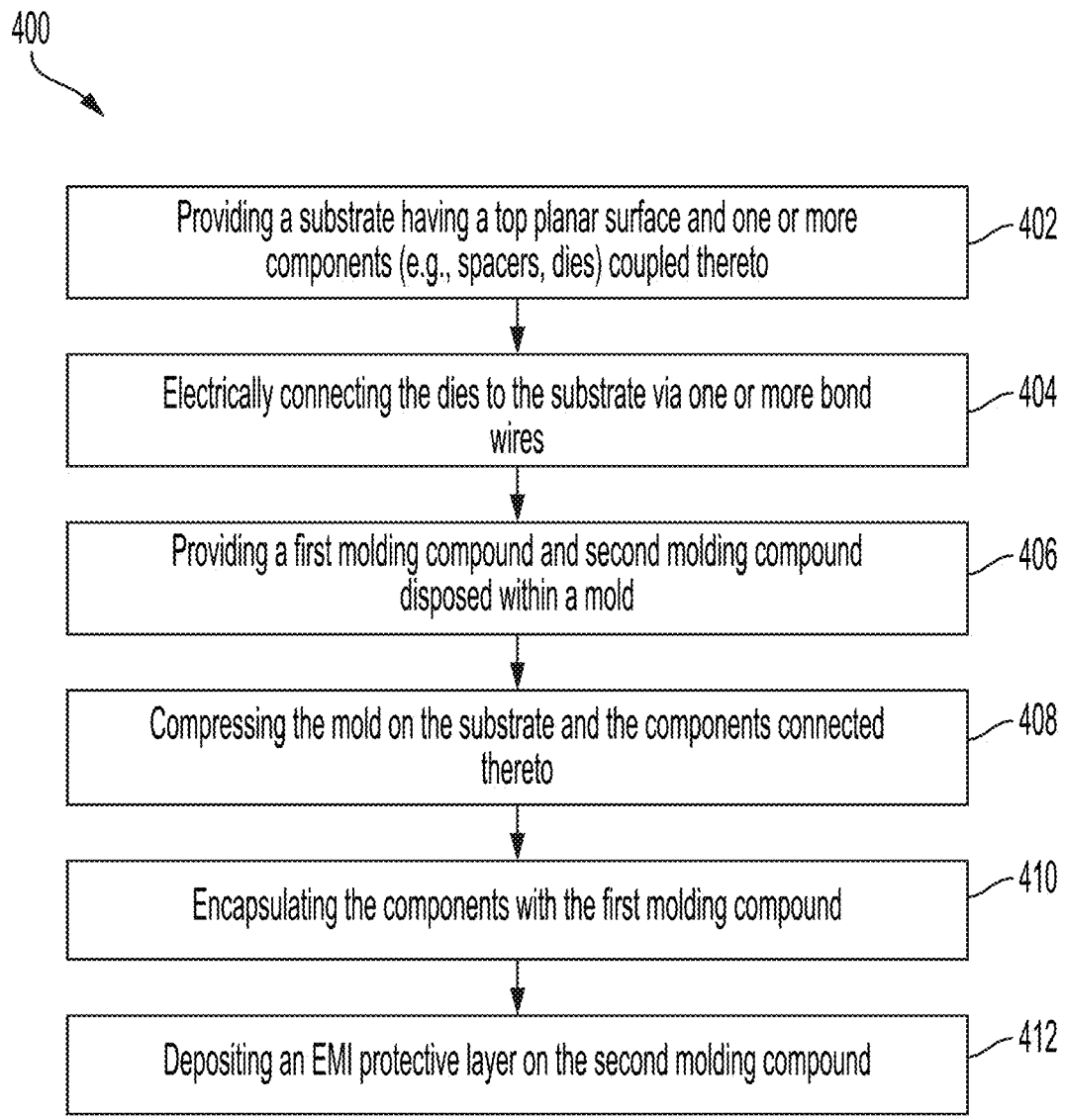
FIG. 4 is an exemplary flowchart illustrating a method of assembling the semiconductor device package of FIG. 1 in accordance with an exemplary embodiment of the present disclosure.

Referring to FIG. 4, there is shown a flow chart outlining steps of a method, generally designated 400, of forming a semiconductor device package, in accordance with an exemplary embodiment of the present disclosure. In some embodiments, the method 400 may include the step 402 of providing a substrate having a top planar surface and one or more components (e.g., spacers, dies) coupled thereto. For example, substrate 102 having a top planar surface 104 may be provided. The substrate 102 includes components connected thereto such as the first and second spacers 108a, 108b, the first semiconductor die 106, the second semiconductor die 114, and/or the die mounted spacer 118. In some embodiments, the method 400 may include the step 404 of electrically connecting the dies to the substrate via one or more bond wires. For example, bond wires 116 may be wire bonded to the second semiconductor die 114 and to the substrate 102 such that the second semiconductor die 114 is electrically connected to substrate 102. Although not shown, additional bond wires may electrically connect the first semiconductor die 106 to substrate 102 and/or to the second semiconductor die 114. In some embodiments, the substrate 102 and first semiconductor die 106 define at least a portion of tunnel 112.

In some embodiments, the method 400 may include the step 406 of providing a first molding compound and second molding compound disposed within a mold. For example, the first molding compound 120 and second molding compound 122 may be provided in a mold 202 as shown in FIG. 3. The second molding compound 122 and/or first molding compound 120 may each be provided in the form of a powder. In some embodiments, the second molding compound 122 is disposed below the first molding compound in the mold 202 as shown in FIG. 3. In some embodiments, the first molding compounding (e.g., in powdered form) is layered over the second molding compounding (e.g., also in powdered form) within the mold. In some embodiments, the volume of the first molding compounding is greater than a volume of the second molding compounding. In some embodiments, the method 400 may include the step 408 of compressing the mold onto the substrate and the components connected thereto. For example, as shown in FIG. 3, the mold 202 may be moved towards substrate 102 and the components connected thereto (e.g., spacers 108a and 108b, first semiconductor die 106, second semiconductor die 114, die mounted spacer 118, and the one or more bond wires 116) such that the mold is compressed onto the substrate 102 and said components. In some embodiments, the first molding compound 120 is separate and distinct from the second molding compound 122.

In some embodiments, the method 400 may include the step 410 of encapsulating the components with the first molding compound. For example, as shown in FIG. 1, the first molding compound 120 encapsulates the first and second spacers 108a and 108b, first semiconductor die 106, second semiconductor die 114, die mounted spacer 118, and the one or more bond wires 116. In some embodiments, tunnel 112 is substantially filed by the first molding compound 120 during step 410. Referring back to step 408, the pressure generated by compressing the mold onto the substrate 102, may cause the first and second molding compounds 120 and 122 to transition from a powder form to a flowable state wherein the first molding compound 120 may encapsulate the above mentioned components. In some embodiments, the first molding compound 120, when in a flowable state, has a viscosity that is less than a viscosity of the second molding compound 122, when the second molding compound 122 is in a flowable state. In some embodiments, the first molding compound 120 substantially fills the tunnel 112. In some embodiments, the first molding compound 120 is configured to prevent wire sweep of the bond wires 116. In some embodiments, the first molding compound 120 has a viscosity of up to 10 pascal-seconds. In some embodiments, the volume of the first molding compound is greater than the volume of the second molding compound. In some embodiments, second molding compound 122 is separated from first semiconductor die 106 and/or the other components coupled to substrate 102 by a portion of the first molding compound 120.

In some embodiments, the method 400 may include the step 412 of depositing an EMI protective layer on the second molding compound. In some embodiments, the EMI protective layer may be deposited after the first and second molding compound has hardened. In some embodiments, the EMI protective layer may be deposited over second molding compound by physical vapor deposition. For example, as shown in FIG. 1, the EMI protective layer 124 covers at least a top surface 123 of the second molding compound 122. In some embodiments, the second molding compound 122 has a higher adhesion strength to the EMI protective layer 124 than the adhesion strength of the first molding compound 120 to the EMI protective layer 124.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. The words "inwardly" and "outwardly" refer to directions toward and away from, respectively, the geometric center of the ball grid array having a multi-surface trace interface. Unless specifically set forth herein, the terms "a", "an" and "the" are not limited to one element but instead should be read as meaning "at least one". When specifying a numerical value or range of values, the term "about" means+/−10% unless otherwise defined.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor device package comprising:
    a substrate having a top planar surface;
    a first semiconductor die electrically connected to the top planar surface of the substrate, wherein the substrate and the first semiconductor die define at least a portion of a tunnel;
    a first molding compound at least partially encapsulating the first semiconductor die and substantially filling the tunnel; and
    a second molding compound formed on a top surface of the first molding compound, wherein the second molding compound is separate and distinct from the first molding compound,
    wherein the first molding compound, when in a flowable state, has a viscosity that is lower than a viscosity of the second molding compound when the second molding compound is in a flowable state.

2. The semiconductor device package of claim 1 further comprising:
    an electromagnetic interference protective layer adhered to a top surface of the second molding compound.

3. The semiconductor device package of claim 2, wherein the second molding compound has a higher adhesion strength to the electromagnetic interference protective layer than an adhesion strength of the first molding compound to the electromagnetic interference protective layer.

4. The semiconductor device package of claim 1 further comprising:
    a second semiconductor die mounted on the top planar surface of the substrate and positioned within the tunnel; and
    one or more bond wires electrically connecting the second semiconductor die to the substrate,
    wherein the first molding compound is configured to reduce the occurrence of wire sweep of the one or more bond wires.

5. The semiconductor device package of claim 1, wherein the first molding compound and second molding compound each have a corresponding volume and the volume of the first molding compound is greater than the volume of the second molding compound.

6. The semiconductor device package of claim 1, further comprising:
    two or more spacers mounted to the top planar surface of the substrate, wherein the two or more spacers, the first semiconductor die, and the top planar surface of the substrate define the tunnel,
    wherein the first semiconductor dies is mounted on a top planar surface of each of the two or more spacers.

7. The semiconductor device package of claim 1, wherein the first molding compound is a type of epoxy mold compound including epoxy resin and silica fillers.

8. The semiconductor device package of claim 1, wherein the second molding compound is a type of epoxy mold compound including modified epoxy resin and silica fillers.

9. The semiconductor device package of claim 1, wherein the first molding compound has a viscosity of up to 10 pascal-seconds.

10. A semiconductor device package comprising:
    a substrate means for providing electrical communication to one or more electrical components coupled to the substrate means;
    one or more storage means for providing a first storage amount and connected to a top planar surface of the substrate means, the one or more storage means and the substrate means defining at least a portion of a tunnel;
    a first control means for providing electrical communication with the first storage means, the first control means mounted on the top planar surface of the substrate means and positioned within the tunnel;
    a first encapsulation means for at least partially encapsulating the one or more spacing means, the first storage means, and the first control means, the first encapsulation means substantially filling the tunnel; and
    a second encapsulation means for covering a top planar surface of the first encapsulation means,
    wherein the first encapsulation means, when in a flowable state, has a viscosity that is lower than a viscosity of the second encapsulation means, when in a flowable state, and
    wherein the first encapsulation means is separate and distinct from the second encapsulation means.

11. The semiconductor device package of claim 10 further comprising:
    a protective means for providing protection to the semiconductor device package from electromagnetic interference, the protective means adhered to at least a top surface of the second encapsulation means.

12. The semiconductor device package of claim 11, wherein the second encapsulation means has a higher adhesion strength to the protective means than an adhesion strength of the first encapsulation means to the protective means.

13. The semiconductor device package of claim 10 further comprising:
    one or more electrical connection means for electrically connecting the first control means to the substrate means,
    wherein the first encapsulation means is configured to reduce the occurrence of wire sweep of the one or more electrical connection means.

14. The semiconductor device package of claim 10, wherein the first encapsulation means and second encapsulation means each have a corresponding volume and the volume of the first encapsulation means is greater than the volume of the second encapsulation means.

15. A method of forming a semiconductor device package comprising:

providing a substrate having a top planar surface and one or more components coupled to the substrate, the one or more components comprising:
  a first semiconductor die connected to the top planar surface of the substrate, wherein the substrate and the first semiconductor die defines at least a portion of a tunnel; and
  a second semiconductor die mounted on the top planar surface of the substrate and positioned within the tunnel, the second semiconductor die electrically connected to the substrate by one or more bond wires;
forming a mold, the mold including:
  a first molding compound; and
  a second molding compound, wherein the second molding compound is separate and distinct from the first molding compound,
  wherein the first molding compound, when in a flowable state, has a viscosity that is less than a viscosity of the second molding compound, when in a flowable state; and
compressing the mold on the substrate causing the first molding compound to liquify and encapsulate the semiconductor die and substantially fill the tunnel,
wherein the first molding compound at least partially encapsulates the first semiconductor die and the second semiconductor die, and
wherein the second molding compound is separated from the first semiconductor die by a portion of the first molding compound.

16. The method of claim 15 further comprising:
depositing an electromagnetic interference protective layer to at least a top surface of the second molding compound.

17. The method of claim 16, wherein the second molding compound has a higher adhesion strength to the electromagnetic interference protective layer than an adhesion strength of the first molding compound to the electromagnetic interference protective layer.

18. The method of claim 15, wherein the first molding compound is configured to reduce the occurrence of wire sweep of the one or more bond wires.

19. The method of claim 15, wherein a volume of the first molding compound is greater than a volume of the second molding compound.

20. The method of claim 15, wherein the first molding compound has a viscosity of up to 10 pascal-seconds.

* * * * *